United States Patent
Kumar et al.

(10) Patent No.: US 7,439,449 B1
(45) Date of Patent: Oct. 21, 2008

(54) FLEXIBLE CIRCUIT FOR ESTABLISHING ELECTRICAL CONNECTIVITY WITH OPTICAL SUBASSEMBLY

(75) Inventors: Dev E. Kumar, San Jose, CA (US); Giorgio Giaretta, Mountain View, CA (US); Stefano Schiaffino, Menlo Park, CA (US); Donald A. Ice, Milpitas, CA (US)

(73) Assignee: Finisar Corporation, Sunnyvale, CA (US)

( * ) Notice: Subject to any disclaimer, the term of this patent is extended or adjusted under 35 U.S.C. 154(b) by 318 days.

(21) Appl. No.: 10/409,837

(22) Filed: Apr. 9, 2003

Related U.S. Application Data

(63) Continuation-in-part of application No. 10/231,395, filed on Aug. 29, 2002, now Pat. No. 6,703,561, which is a continuation-in-part of application No. 10/077,067, filed on Feb. 14, 2002, now Pat. No. 6,586,678.

(51) Int. Cl.
*H05K 1/00* (2006.01)
(52) U.S. Cl. .................. 174/254; 174/260; 361/749
(58) Field of Classification Search ............ 174/254, 174/261; 361/749–751, 808, 799, 788; 257/690, 257/698, 689
See application file for complete search history.

(56) References Cited

U.S. PATENT DOCUMENTS

| | | |
|---|---|---|
| 3,271,214 A | 9/1966 | Tabor |
| 3,629,787 A | 12/1971 | Wilson |
| 3,987,676 A | 10/1976 | Bennewitz |
| 4,011,980 A | 3/1977 | Dvorak et al. |
| 4,092,061 A | 5/1978 | Stigliani, Jr. |
| 4,128,697 A | 12/1978 | Simpson |
| 4,162,817 A | 7/1979 | Briggs et al. |
| 4,179,802 A | 12/1979 | Joshi et al. |
| 4,295,696 A | 10/1981 | Gray |
| 4,375,578 A | 3/1983 | Mitchell et al. |
| 4,435,031 A | 3/1984 | Black et al. |

(Continued)

FOREIGN PATENT DOCUMENTS

CN 2032364 2/1989

(Continued)

OTHER PUBLICATIONS

XFP MSA Group, http://www.org/cgi-bin/home.cgi.*

(Continued)

*Primary Examiner*—Dean A. Reichard
*Assistant Examiner*—Yuriy Semenenko
(74) *Attorney, Agent, or Firm*—Workman Nydegger

(57) ABSTRACT

Flexible printed circuit boards interconnect to adjacent electronic devices through one or more of high speed data, low speed data, high current, and ground lines and pads. The design of the high speed data pads and traces and adjacent ground pads and traces maintains a desired impedance in the flexible circuit and at the transition from the flexible circuit to a printed circuit board, a ceramic header, or other device to ensure high speed operation. The pads are preferably arranged in a two dimensional geometry such that a connecting area of the flexible circuit is narrower than it would preferably be if the pads were arranged linearly. The two dimensional array also allows the use of the high current thermoelectric cooler pads, which require large surface areas that may otherwise not fit in a conventional linear array.

7 Claims, 8 Drawing Sheets

U.S. PATENT DOCUMENTS

| | | | |
|---|---|---|---|
| 4,435,740 A | 3/1984 | Huckabee et al. | |
| 4,769,684 A | 9/1988 | Crocker et al. | |
| 4,815,990 A | 3/1989 | Ristedt et al. | |
| 4,818,099 A | 4/1989 | Preikschat et al. | |
| 4,952,016 A | 8/1990 | Adams et al. | |
| 4,953,006 A | 8/1990 | Kovats et al. | |
| 4,962,991 A | 10/1990 | Carvalho | |
| 4,973,211 A | 11/1990 | Potucek | |
| 5,044,980 A | 9/1991 | Krumme et al. | |
| 5,125,054 A | 6/1992 | Ackley et al. | |
| 5,136,682 A | 8/1992 | Moyer et al. | |
| 5,159,535 A | 10/1992 | Desai et al. | |
| 5,212,345 A | 5/1993 | Gutierrez | |
| 5,249,245 A | 9/1993 | Lebby et al. | |
| 5,253,311 A | 10/1993 | Killen et al. | |
| 5,262,590 A | 11/1993 | Lia | |
| 5,299,276 A | 3/1994 | Okamura et al. | |
| 5,343,360 A * | 8/1994 | Sanwo | 361/707 |
| 5,359,686 A | 10/1994 | Galloway et al. | |
| 5,361,317 A | 11/1994 | Hartman et al. | |
| 5,371,820 A | 12/1994 | Welbourn et al. | |
| 5,371,822 A | 12/1994 | Horwitz et al. | |
| 5,375,184 A | 12/1994 | Sullivan | |
| 5,389,686 A | 2/1995 | Diop et al. | |
| 5,409,384 A | 4/1995 | Green et al. | |
| 5,414,786 A | 5/1995 | Ohta et al. | |
| 5,420,954 A | 5/1995 | Swirhun et al. | |
| 5,428,190 A * | 6/1995 | Stopperan | 174/261 |
| 5,432,630 A | 7/1995 | Lebby et al. | |
| 5,452,182 A | 9/1995 | Eichelberger et al. | |
| 5,462,441 A | 10/1995 | Renn et al. | |
| 5,471,552 A | 11/1995 | Wuu et al. | |
| 5,474,463 A | 12/1995 | Robinson et al. | |
| 5,479,288 A | 12/1995 | Ishizuka et al. | |
| 5,495,125 A * | 2/1996 | Uemura | 257/666 |
| 5,499,312 A | 3/1996 | Hahn et al. | |
| 5,539,848 A | 7/1996 | Galloway | |
| 5,545,846 A | 8/1996 | Williams et al. | |
| 5,596,662 A | 1/1997 | Boscher | |
| 5,613,024 A | 3/1997 | Shahid | |
| 5,625,734 A * | 4/1997 | Thomas et al. | 385/88 |
| 5,638,469 A | 6/1997 | Feldman et al. | |
| 5,666,449 A | 9/1997 | Sawae et al. | |
| 5,703,895 A | 12/1997 | Ghirardi et al. | |
| 5,706,378 A | 1/1998 | Suzuki et al. | |
| 5,717,800 A | 2/1998 | Funabashi | |
| 5,733,151 A | 3/1998 | Edsall et al. | |
| 5,752,851 A | 5/1998 | Zaderej et al. | |
| 5,774,614 A | 6/1998 | Gilliland et al. | |
| 5,788,143 A | 8/1998 | Boyd et al. | |
| 5,844,783 A * | 12/1998 | Kojima | 361/777 |
| 5,894,409 A | 4/1999 | Tanaka | |
| 5,974,214 A | 10/1999 | Shacklette et al. | |
| 5,996,222 A | 12/1999 | Shangguan et al. | |
| 6,010,359 A | 1/2000 | Etters et al. | |
| 6,011,695 A * | 1/2000 | Dumke | 361/777 |
| 6,017,222 A | 1/2000 | Kao | |
| 6,039,600 A | 3/2000 | Etters et al. | |
| 6,040,624 A | 3/2000 | Chambers et al. | |
| 6,043,990 A | 3/2000 | Johnson et al. | |
| 6,045,269 A | 4/2000 | Watanabe et al. | |
| 6,069,991 A | 5/2000 | Hibbs-Brenner et al. | |
| 6,088,498 A | 7/2000 | Hibbs-Brenner et al. | |
| 6,091,475 A | 7/2000 | Ogino et al. | |
| 6,118,072 A | 9/2000 | Scott | |
| 6,118,666 A | 9/2000 | Aoki et al. | |
| 6,162,065 A | 12/2000 | Benham | |
| 6,181,011 B1 * | 1/2001 | Rostoker et al. | 257/758 |
| 6,195,261 B1 | 2/2001 | Babutzka et al. | |
| 6,268,231 B1 | 7/2001 | Wetzel | |
| 6,294,255 B1 | 9/2001 | Suzuki et al. | |
| 6,300,164 B1 | 10/2001 | Call et al. | |
| 6,305,848 B1 | 10/2001 | Gregory | |
| 6,326,553 B1 | 12/2001 | Yim et al. | |
| 6,350,063 B1 | 2/2002 | Gilliland et al. | |
| 6,380,493 B1 * | 4/2002 | Morita et al. | 174/258 |
| 6,404,960 B1 | 6/2002 | Hibbs-Brenner et al. | |
| 6,439,918 B1 | 8/2002 | Togami et al. | |
| 6,473,314 B1 * | 10/2002 | Custer et al. | 316/818 |
| 6,483,712 B1 | 11/2002 | Oliphant et al. | |
| 6,485,322 B1 | 11/2002 | Branch et al. | |
| 6,521,989 B2 | 2/2003 | Zhou | |
| 6,537,082 B2 | 3/2003 | Hopfer, III et al. | |
| 6,580,739 B1 | 6/2003 | Coldren | |
| 6,586,678 B1 | 7/2003 | Rosenberg et al. | 174/52.5 |
| 6,617,518 B2 * | 9/2003 | Ames et al. | 174/254 |
| 6,624,000 B1 | 9/2003 | Coldren | |
| 6,700,079 B2 | 3/2004 | Bogursky et al. | |
| 6,703,561 B1 | 3/2004 | Rosenberg et al. | 174/52.5 |
| 6,709,607 B2 | 3/2004 | Hibbs-Brenner et al. | |
| 6,734,658 B1 | 5/2004 | Bierer | |
| 6,767,220 B2 | 7/2004 | Wilson et al. | |
| 6,769,920 B1 | 8/2004 | Mease et al. | |
| 6,781,727 B2 | 8/2004 | Auracher et al. | |
| 6,800,169 B2 | 10/2004 | Liu et al. | |
| 6,809,905 B2 | 10/2004 | Kilmer | |
| 6,812,803 B2 * | 11/2004 | Goergen | 333/1 |
| 6,841,733 B2 | 1/2005 | Schiaffino et al. | |
| 6,852,928 B2 | 2/2005 | Giaretta et al. | |
| 6,860,649 B2 | 3/2005 | Edwards et al. | |
| 6,863,453 B2 | 3/2005 | Wang et al. | |
| 6,867,368 B2 | 3/2005 | Kumar et al. | |
| 6,867,377 B2 | 3/2005 | Anderson et al. | |
| 6,878,875 B2 | 4/2005 | Aronson et al. | |
| 6,911,599 B2 | 6/2005 | Rosenberg et al. | |
| 6,947,672 B2 | 9/2005 | Jiang et al. | |
| 6,996,304 B2 | 2/2006 | Aronson et al. | |
| 7,010,233 B2 | 3/2006 | Lindblad | |
| 7,066,659 B2 | 6/2006 | Aronson et al. | |
| 7,275,937 B2 | 10/2007 | Ellison | |
| 7,311,240 B2 | 12/2007 | Nippa et al. | |
| 2001/0017376 A1 * | 8/2001 | Verdiell | |
| 2002/0136501 A1 | 9/2002 | Yen et al. | |
| 2002/0170742 A1 * | 11/2002 | Liaw et al. | 174/250 |
| 2002/0181895 A1 | 12/2002 | Gilliland et al. | |
| 2003/0102157 A1 * | 6/2003 | Rosenberg et al. | 174/261 |
| 2003/0197254 A1 | 10/2003 | Huang | |
| 2004/0018409 A1 | 1/2004 | Hui et al. | |
| 2004/0062491 A1 | 4/2004 | Sato et al. | |
| 2004/0090620 A1 | 5/2004 | Farr | |
| 2004/0092135 A1 | 5/2004 | Hofmeister et al. | |
| 2004/0151505 A1 | 8/2004 | Aronson et al. | |
| 2004/0202214 A1 | 10/2004 | Aronson et al. | |
| 2005/0018409 A1 * | 1/2005 | Hirakata | 361/752 |
| 2005/0045374 A1 | 3/2005 | Kumar | |
| 2005/0130488 A1 | 6/2005 | Zhu et al. | |
| 2005/0244095 A1 | 11/2005 | Ellison | |
| 2005/0245103 A1 | 11/2005 | Ellison | |
| 2005/0245118 A1 | 11/2005 | Liu et al. | |
| 2005/0265650 A1 | 12/2005 | Priyadarshi et al. | |
| 2006/0032665 A1 | 2/2006 | Ice | |
| 2006/0062526 A1 | 3/2006 | Ikeuchi | |

FOREIGN PATENT DOCUMENTS

| | | |
|---|---|---|
| GB | 0 881 671 | 12/1998 |
| GB | 0 905 838 | 3/1999 |
| JP | 61-071689 | 4/1986 |
| JP | 62-114545 | 5/1987 |
| JP | 63-136680 | 6/1988 |
| JP | 01-169986 | 5/1989 |
| JP | 02-240989 | 9/1990 |
| JP | 03-0148190 | 6/1991 |
| JP | 406034838 | 2/1994 |

| | | |
|---|---|---|
| JP | 407159636 | 6/1995 |
| JP | 09-223848 | 8/1997 |
| JP | 2000228006 | 8/2000 |
| WO | 92/00538 | 1/1992 |

OTHER PUBLICATIONS

Murata, S., Nishimura, K., *Improvement in Thermal Properties of a Multi-Beam Laser Diode Array*, Japanese Journal of Applied Physics, vol. 28, Supp. 28-3, pp. 165-170 (1989).
U.S. Appl. No. 11/179,223, filed Jul. 11, 2005, Ice.
U.S. Appl. No. 10/835,832, filed Apr. 30, 2004, Kumar et al.
U.S. Appl. No. 10/836,728, filed Apr. 30, 2004, Ellison.
U.S. Appl. No. 11/094,990, filed Mar. 31, 2005, Liu et al.
U.S. Appl. No. 10/687,107, filed Oct. 16, 2003, Aronson et al.
U.S. Appl. No. 10/836,129, filed Apr. 30, 2004, Nippa et al.
Ali, "New Materials and Design Components for Integrated Optics," Technology Report/Fiberoptics, Laser Focus World, vol. 21, No. 8, Aug. 1985, Tulsa, U.S., pp. 48-50.
Cohen, "Passive Laser-Fiber Alignment by Index Method," IEEE Photonics Technology Letters, vol. 3, No. 11, Dec. 1991, pp. 985-987, New York, U.S.
Coldren, et al., "Flip-Chip Bonded, Back-Emitting, Microlensed Arrays of Monolithic Vertical Cavity Lasers and Resonant Photodetectors," Electronic Components and Technology Conference, Sep. 1999, pp. 733-740.
Havant, "Flexible Interposing Carrier Scheme for Optical Waveguides," Research Disclosure No. 303, Jul. 1989, p. 512.
Hibbs-Brenner, et al., "Packaging of VCSEL Arrays for Cost-Effective Interconnects at <10 Meters," Electronic Components and Technology Conference, Sep. 1999, pp. 747-752.
Hsu, et al., "Flip-chip Approach to Endfire Coupling Between Single-Mode Optical Fibres and Channel Waveguides," Patent Associates Literature, Electronic Letters, vol. 12, No. 16, pp. 404-405, Aug. 5, 1976.
Kazlas, et al., "Monolithic Vertical-Cavity Laser/p-i-n Photodiode Transceiver Array for Optical Interconnects," IEEE Photonics Technology Letters, Nov. 1998, pp. 1530-1532, vol. 10, No. 11.
Louderback, et al., "Flip Chip Bonded Arrays of Monolithically Integrated, Microlensed Vertical-Cavity Lasers and Resonant Photodetectors," IEEE Photonics Technology Letters, Mar. 1999, pp. 304-306, vol. II, No. 3.
Plawsky, et al., "Photochemically Machined, Glass Ceramic, Optical Fiber Interconnection Components," Article, Optoelectronic Materials, Devices, Packaging and Interconnects (1998), SPIE, vol. 994, pp. 101-106.
Sullivan, et al., "Polymeric Waveguides," 1992 IEEE, pp. 27-31.
XFP MSA Group; http://www.org/cgi-bin/home.cgi.
U.S. Appl. No. 10/629,724, Mail Date Sep. 22, 2004, Notice of Allowance.
U.S. Appl. No. 10/687,107, Mail Date Oct. 6, 2006, Office Action.
U.S. Appl. No. 10/687,107, Mail Date Apr. 10, 2007, Office Action.
U.S. Appl. No. 10/687,107, Mail Date Oct. 17, 2007, Office Action.
U.S. Appl. No. 10/835,832, Mail Date Oct. 19, 2005, Office Action.
U.S. Appl. No. 10/835,832, Mail Date Jun. 7, 2006, Office Action.
U.S. Appl. No. 10/835,832, Mail Date Dec. 15, 2006, Office Action.
U.S. Appl. No. 10/835,832, Mail Date Aug. 9, 2007, Office Action.
U.S. Appl. No. 10/835,832, Mail Date Dec. 28, 2007, Office Action.
U.S. Appl. No. 10/836,728, Mail Date Jul. 19, 2005, Office Action.
U.S. Appl. NO. 10/836,728, Mail Date Jan. 18, 2006, Office Action.
U.S. Appl. No. 10/836,728, Mail Date May 5, 2006, Office Action.
U.S. Appl. No. 10/836,728, Mail Date Jan. 16, 2007, Office Action.
U.S. Appl. No. 10/836,728, Mail Date May 30, 2007, Notice of Allowance.
U.S. Appl. No. 10/836,728, Mail Date Jul. 25, 2007, Notice of Allowance.
U.S. Appl. No. 10/795,597, Mail Date Aug. 25, 2004, Notice of Allowance.
U.S. Appl. No. 10/795,597, Mail Date Jan. 26, 2005, Notice of Allowance.
U.S. Appl. No. 10/836,129, Mail Date Mar. 13, 2006, Office Action.
U.S. Appl. No. 10/836,129, Mail Date Aug. 10, 2007, Notice of Allowance.
U.S. Appl. No. 11/029,067, Mail Date Jun. 29, 2005, Notice of Allowance.
U.S. Appl. No. 11/094,990, Mail Date Mar. 28, 2006, Office Action.
U.S. Appl. No. 11/094,990, Mail Date Oct. 12, 2006, Office Action.
U.S. Appl. No. 11/094,990, Mail Date Apr. 5, 2007, Office Action.
U.S. Appl. No. 11/094,990, Mail Date Dec. 6, 2007, Office Action.
U.S. Appl. No. 11/094,990, Mail Date May 6, 2008, Notice of Allowance.
U.S. Appl. No. 11/179,223, Mail Date Feb. 23, 2007, Office Action.
U.S. Appl. No. 11/179,223, Mail Date Nov. 19, 2007, Office Action.
Office Action, May 22, 2007, JPO, JP Application No. 2003-568752, "Header Assembly Having Integrated Cooling Device".
Office Action, Sep. 21, 2007, SIPO of China, CN Application No. 03808386.8, "Header Assembly Having Integrated Cooling Device".
U.S. Appl. No. 10/231,395, Mail Date Sep. 24, 2003, Notice of Allowance.
U.S. Appl. No. 10/629,253, Mail Date Feb. 24, 2005, Office Action.
U.S. Appl. No. 10/629,253, Mail Date Oct. 4, 2005, Office Action.
U.S. Appl. No. 10/629,253, Mail Date Feb. 3, 2006, Notice of Allowance.
U.S. Appl. No. 10/748,051, Mail Date May 27, 2004, Office Action.
U.S. Appl. No. 10/748,051, Mail Date Dec. 3, 2004, Notice of Allowance.

* cited by examiner

FLEXIBLE CIRCUIT FOR ESTABLISHING ELECTRICAL CONNECTIVITY WITH OPTICAL SUBASSEMBLY

CROSS-REFERENCE TO RELATED APPLICATIONS

This application is a continuation-in-part of U.S. patent application Ser. No. 10/231,395, filed Aug. 29, 2002 now U.S. Pat. No. 6,703,561, entitled "Header Assembly Having Integrated Cooling Device, which is a continuation-in-part of U.S. patent application Ser. No. 10/077,067, filed Feb. 14, 2002, now U.S. Pat. No. 6,586,678 entitled "Ceramic Header Assembly, and U.S. patent application Ser. No. 10/101,260, filed Mar. 18, 2002, entitled "Compact Laser Package with Integrated Temperature Control," which in turn claims the benefit of U.S. Provisional Patent Application Ser. No. 60/317,835, filed Sep. 6, 2001, entitled "Compact Laser Package with Integrated Temperature Control," each of which is incorporated herein by reference.

BACKGROUND OF THE INVENTION

1. The Field of the Invention

The present invention relates generally to high speed data transmission systems. More particularly, embodiments of the invention relate to devices and methods for conductively connecting a flexible circuit to adjacent electrical devices such as, for example, a transmitter optical subassembly or receiver optical subassembly and a printed circuit board.

2. The Relevant Technology

Transceiver modules are widely used in the field of optoelectronics. Typically, a transceiver module comprises a transmitter optical subassembly (TOSA) and a receiver optical subassembly (ROSA). Each of the TOSA and the ROSA may have an optical receptacle, for example an LC cable receptacle or an SC cable receptacle, at one end for attachment to an optical cable and some device to enable a conductive connection to a printed circuit board at the other. The entire transceiver module, in turn, is connected to a computer system, such as a host system, for controlling the operation of the transceiver module. Thus, the computer system can direct the transceiver module to transmit an optical signal by directing an electronic signal through the printed circuit board and into the TOSA. The TOSA then generates an optical signal via an internal laser or light emitting diode (LED) and directs the optical signal into the outgoing optical cable. Similarly, the ROSA receives an optical signal via a photodiode from the incoming optical cable and transmits the signal to a printed circuit board and on to the computer system.

Providing an optimal connection between a TOSA and/or a ROSA and a printed circuit board, however, can be difficult. For example, within a transceiver module the TOSA and the ROSA must be positioned within small tolerances to achieve the desired optical performance. Similarly, the printed circuit board must typically be precisely positioned for its connections to adjacent devices. Adding a third layer of rigid alignment requirements (the PCB to the TOSA and/or ROSA) makes accurately positioning the devices difficult. Additionally, the TOSA and the ROSA often experience vibration and movement as optical cables are moved, attached and detached. The printed circuit board may thereby be damaged or even crack if it is rigidly attached to the TOSA and/or ROSA at one end and a transceiver module housing at the other. Differential thermal contraction/expansion can also cause problems if the devices are rigidly attached.

Accordingly, flexible circuits may be disposed between the TOSA and/or ROSA and the printed circuit board to electrically interconnect them while isolating the printed circuit board from vibration or thermal expansion or contraction of the adjacent devices. The flexible circuit is additionally advantageous in that, during production, the printed circuit board may be mechanically fixed in place while the TOSA and/or ROSA are not, or vice versa. Accordingly, a flexible circuit is frequently used for assembly of the module so that variations in device subassembly position do not prevent precise connections and alignments from being made between the TOSA and/or ROSA and the printed circuit board.

Additionally, the TOSA and/or ROSA may include a transistor-outline header to contain and protect the active devices within the TOSA and/or ROSA. The transistor-outline header ("TO-can") in turn allows the electrical connection of the active devices in the TOSA and/or ROSA to the printed circuit board, via a flexible circuit board or otherwise. With respect to their construction, transistor headers often consist of a cylindrical metallic base with a number of conductive pins extending completely through, and generally perpendicular to, the base. One conventional method of conductively connecting a flexible circuit to a transistor header comprises pins on the transistor header that connect to reinforced openings on one end of the flexible circuit, which are then soldered to affix the flexible circuit and ensure reliable connections. In turn, the other end of the flexible circuit is attached to "finger" like traces on the rigid PCB, via soldering or otherwise. Such soldered contacts are typically aligned in a linear row along the edge of the PCB.

As optical devices such as TOSAs increase in performance and speed, however, additional conductive traces with different shapes and connectivity requirements are required. The number of such traces, as many as fifteen or more, often exceeds the capacity for conventional flexible circuit designs to make contact with adjacent electronic devices. Additionally, both because devices are manufactured according to industry standards and due to the industry pressure for increasingly smaller devices, simply enlarging the size of a contact interface is not always an option.

Accordingly, what is needed are novel devices and systems for improving the performance of conductive traces on a flexible circuit while simultaneously increasing the density of contacts at an interface with adjacent electrical devices.

SUMMARY OF EMBODIMENTS OF THE INVENTION

In general, embodiments of the invention are concerned with devices including various features directed to connecting a flexible printed circuit board ("flexible circuit") to adjacent electronic devices. More particularly, flexible circuits according to the invention conduct electrical, electrostatic, and electromagnetic signals from a first electronic device, such as a ceramic header assembly on a transmitter optical subassembly (TOSA) or a receiver optical subassembly (ROSA), to a second electronic device, such as a rigid or conventional printed circuit board. The connections between the flexible circuit and adjacent electronic devices preferably may include, for example, high current lines and pads (e.g. DC), such as to power a thermoelectric cooler (TEC), low speed lines and pads (e.g. DC), such as to communicate with thermistors or monitor photodiodes, and high speed data lines and pads (e.g. RF) connections, although other connections may be compatible and are included within the scope of the invention.

The flexible circuits according to the invention preferably comprise a waveguide design (for example a microstrip, coplanar waveguide, slotline, or the like) to confine and propagate electromagnetic waves along the flexible circuit. Essential to the proper functioning of the flexible circuit is providing the proper impedance of the microstrip or coplanar waveguide design. The impedance for example, in a microstrip, is determined by the width of the trace above the ground plane, the thickness of the substrate, and the dielectric of the substrate. In part, the present invention addresses the challenges in maintaining an effective impedance at the transition from a printed circuit board, a ceramic header, or other device to a flexible circuit. The invention also addresses the challenge of increasing the number and shape of pads on connection surfaces of flexible circuits.

According to one embodiment of the invention a flexible circuit comprises a flexible substrate having first and second opposing surfaces, a first connecting area comprising a first high speed data pad, and a second connecting area comprising a second high speed data pad. A first conductive trace on the first surface of the flexible substrate conductively connects the first high speed data pad to the second high speed data pad. A ground trace on the second surface of the flexible substrate has at least one contact pad on at least one of the first connecting area and the second connecting area and has a portion that is adjacent to but not in contact with at least one of the first high speed data pad and the second high speed data pad in a shape selected to optimize high speed data performance.

According to another embodiment of the invention a flexible circuit comprises a flexible substrate and a first connecting area comprising a plurality of conductive pads arranged in a two dimensional geometry. The two dimensional geometry is such that the first connecting area has a width that is narrower than it would preferably be if the plurality of pads were arranged linearly in a row perpendicular to a length of the flexible circuit. The pads may include, for example, low speed data pads, high speed data pads, and high current pads, such as to operate a thermoelectric cooler. The two dimensional array allows the high current pads to have a larger surface area than would otherwise fit in a linear array and allows for specialized geometries for the high speed data pads. According to various embodiments of the invention the high current pads have a surface area that is larger, even twice, the surface area of the adjacent pads.

According to yet another embodiment of the invention, an electrical device comprises a first electronic device having a first interface surface, a second device having a second interface surface, and a flexible circuit contacting the first and second interface surfaces and conductively interconnecting the two. The first interface surface preferably comprises a two-dimensional array of a high speed data connection surface, a low speed data connection surface, a high current connection surface, and a ground connection surface. The flexible circuit further comprises a ground trace on the second side of the flexible circuit, the ground trace wrapping around the high speed data pad to optimize high speed data performance. An adhesive is optionally used and is interposed between the first interface surface and the flexible circuit. The adhesive conducts only vertically between the first interface surface and the flexible circuit so as to avoid shorts between adjacent connection surfaces or contacts. The use of this "z-axis" adhesive may be used as an alternative to conventional soldering Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages and features of the invention are obtained, a more particular description of the invention briefly described above will be rendered by reference to specific embodiments thereof which are illustrated in the appended drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION OF THE INVENTION

Figure 1:
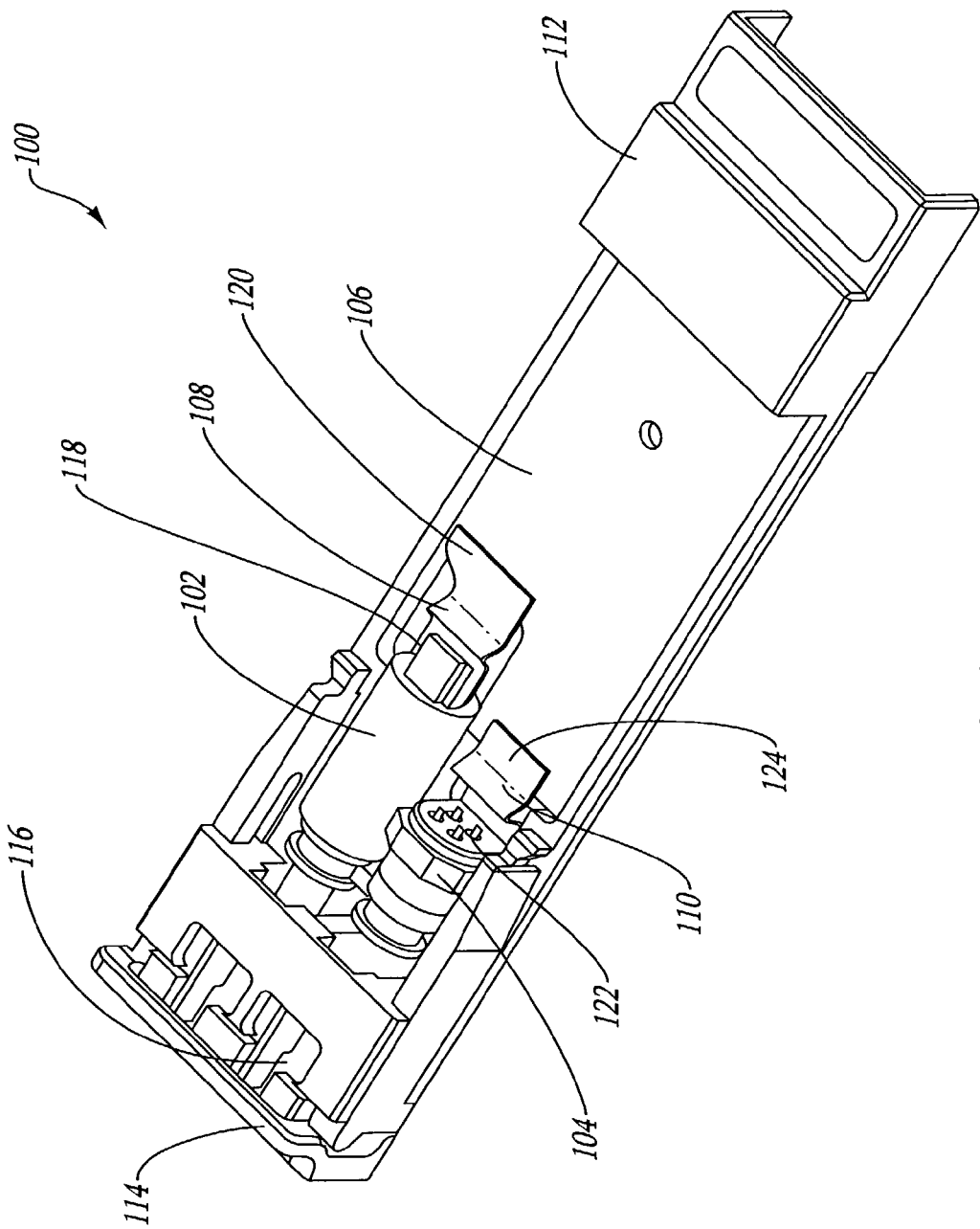
FIG. 1 is a schematic diagram that illustrates aspects of a transceiver module according to embodiments of the invention.

In general, embodiments of the invention are concerned with devices including various features directed to connecting a flexible printed circuit board ("flexible circuit") to adjacent electronic devices. More particularly, flexible circuits according to the invention conduct electrical, electrostatic, and electromagnetic signals from a first electronic device, such as a ceramic header assembly on a transmitter optical subassembly (TOSA) or a receiver optical subassembly (ROSA), to a second electronic device, such as a printed circuit board. Although the flexible circuit may comprise a printed circuit board, for clarity only the second electronic device will be hereinafter referred to as a the printed circuit board. The connections between the flexible circuit and adjacent electronic devices preferably include high current, low speed data, and high speed data connections.

The flexible circuits according to the invention preferably comprise a waveguide design (for example microstrip, coplanar waveguide, slotline, or the like) to confine and propagate electromagnetic waves along the flexible circuit. Generally, microstrips have an unbalanced transmission trace structure that consists of a ground plane on the back side of a substrate, such as a printed circuit board, the dielectric material of the printed circuit board and a relatively narrow strip on the top side of the circuit board. Coplanar waveguides, as their name suggests, are formed on the planar surface of a printed circuit board with ground areas which parallel a signal trace on both sides of the signal trace. Although microstrip or coplanar waveguide designs are presently preferred, any flexible circuit waveguide structure may be compatible with various aspects of the embodiments of the present invention.

Essential to the proper functioning of the flexible circuit is providing the proper impedance of the design. The impedance of the microstrip is determined by the width of the trace above the ground plane, the thickness of the substrate, and the dielectric of the substrate. The impedance of a coplanar waveguide is determined by the overall size of the signal trace, substrate thickness and dielectric, and the width of the gaps on either side. The present invention addresses the challenges in maintaining an effective impedance at the transition from a printed circuit board, a ceramic header, or other device to a flexible circuit.

Reference will now be made to the drawings to describe various aspects of exemplary embodiments of the invention. It is to be understood that the drawings are diagrammatic and schematic representations of such exemplary embodiments, and are not limiting of the present invention, nor are they necessarily drawn to scale.

In the following description, numerous specific details are set forth in order to provide a thorough understanding of the present invention. It will be obvious, however, to one skilled in the art that the present invention may be practiced without these specific details. In other instances, well-known aspects of optical systems have not been described in particular detail in order to avoid unnecessarily obscuring the present invention.

Reference is first made to FIG. 1, which illustrates a perspective view of one presently preferred embodiment of a transceiver module, designated generally at 100. More specifically, the depicted module is an XFP transceiver module, which is a 10-Gigabit XFP Form-Factor Pluggable Module for use in telecommunications networks, local area networks, metro area networks, storage area networks, wide area networks, and the like. XFP transceivers are designed to occupy one-fifth of the space and dissipate one-half the power of prior 10 Gb/s modules. In addition, the depicted module may include a temperature-compensated externally modulated laser (EML) for use in dense wavelength division multiplexing applications (DWDM) and therefore be more completely described as a DWDM EML XFP transceiver module. The transceiver modules constructed according to the invention can be compatible with the XFP MSA standards, for example including those set forth in the 10 Gigabit Small Form Factor Pluggable Module adoption draft specification Revision 2.0 published by the XFP Multi Source Agreement (MSA) Group on Dec. 16, 2002, which is incorporated herein by reference, and can also be compatible with future revisions or final XFP MSA specifications that will be adopted in the future.

As depicted in FIG. 1, XFP transceiver module 100 includes TOSA 102, avalanche photodiode (APD), ROSA 104, printed circuit board 106, first flexible circuit 108 and second flexible circuit 110. First flexible circuit 108 interconnects TOSA 102 and printed circuit board 106 while second flexible circuit 110 interconnects ROSA 104 and printed circuit board 106. Also depicted as part of module 100 are housing 112 for containing the electrical components of module 100 and bail release 114 and LC cable receptacles 116 for receiving and securely attaching LC cables to TOSA 102 and ROSA 104. In the illustrated embodiment of the invention of FIG. 1, first flexible circuit 108 connects to TOSA 102 at first interface 118 and connects to printed circuit board 106 at second interface 120.

TOSA 102 may comprise an EML TOSA as described in FIG. 2 below. Of course, one skilled in the art will recognize that other TOSA assemblies, for example including such features as a ceramic header TOSA, a distributed feedback laser, a VCSEL, an uncooled EML, a cooled EML, an EML with a wavelocker, and the like, are also compatible with embodiments of the present invention.

ROSA 104 may comprise, for example, an avalanche photodiode (APD). An APD is a conventional device that operates with a reverse-bias voltage that causes the primary photocurrent to undergo amplification by cumulative multiplication of charge carriers. In the depicted embodiment, ROSA 104 is depicted as attached to second flexible circuit 110 at a third interface 122 via a conventional TO-Header soldered pin interface. Second flexible circuit 110 is then connected to printed circuit board at fourth interface 124 according to connections and devices as disclosed below with respect to FIGS. 4A and 4B.

First and second flexible circuits 108, 110 and interfaces 118, 120, 122, and 124 are further described below with respect to FIGS. 3-6.

Please note that although the depicted flexible circuits connect to one or more of a TOSA, a ROSA, and a printed circuit board, flexible circuits according to the invention are not limited solely to these exemplary embodiments. Rather, the connection devices and methods disclosed herein may be compatibly incorporated into any design wherein a flexible circuit connects to an adjacent electronic device.

Figure 2:
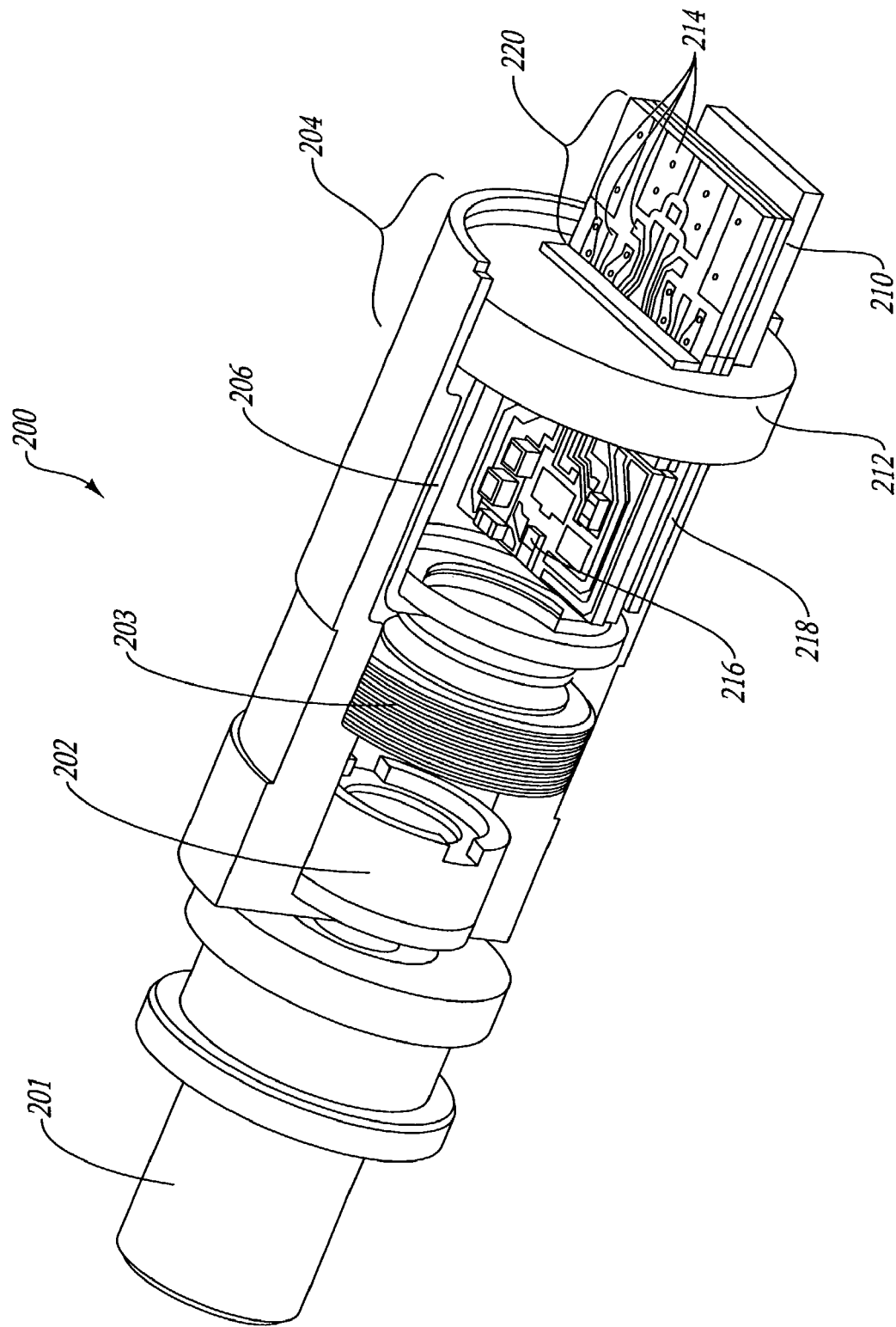
FIG. 2 is another schematic diagram that illustrates aspects of a transmitter optical subassembly according to embodiments of the invention.

Referring now to FIG. 2, one embodiment of a TOSA 102 according to the invention is therein depicted. Accordingly, TOSA 200 generally comprises nosepiece 201 for receiving an LC ferrule, isolator 202, lens assembly 203, and header assembly 204. Generally, transistor headers, or transistor outlines are widely used in the field of optoelectronics, and may be employed in a variety of applications. Header assembly 204 is a particular embodiment of the invention that includes hermetically sealed window can 206, thermal slug 210, base 212, and ceramic feedthrough 220. Accordingly, other embodiments of the invention not depicted or further described herein may incorporate a header assembly not comprising part of a transmitter optical subassembly so long as it has a platform or similar structure for connecting to and receiving electronic signals from a flexible circuit.

As depicted, header assembly 204 comprises a cylindrical metallic base 212 with a ceramic feedthrough 220 having a number of conductive traces 214 thereon extending completely through, and generally perpendicular to, the base. The base can be formed of, by way of example only, Alloy 42, which is an iron nickel alloy, as well as cold-rolled steel, or Vacon VCF-25, and Kovar alloys. A seal between thermal slug 210 and base 212 provides mechanical and environmental protection for the components contained in the TO-can and electrically isolates the conductive traces from the metallic material of the base. The seal may comprise, for example, a hermetically brazed wrap-around metallization on a ceramic header. Alternatively, the thermal slug 210 and ceramic feedthrough 220 may incorporate two additional ceramic outer layers to electrically isolate the outermost conductors. In this second case, a metal braze or solder can be used to hermetically seal thermal slug 210 and ceramic feedthrough 220 to base 212. This solution overcomes the principal shortcomings of glasses, namely their low strength, brittleness, and low thermal conductivity.

The ceramic feedthrough 220 is structured to house multiple electrical components, support thermoelectric cooler ("TEC") 218, and support conductive traces 214 through base 212. The ceramic feedthrough 220 is constructed from an insulating material such as a ceramic and has flat surfaces on either side of base 212 that are configured to receive the multiple electrical components. In the illustrated embodiment, such electrical components include, for example, an EML 216, and resistors, capacitors, and inductors that are used to balance the driving impedance of the laser with the component impedance as well as thermistors, monitor photodiodes, and the like. As it may be important for EML 216 to be precisely positioned perpendicularly to base 212, ceramic feedthrough 220 is, therefore, precisely positioned perpendicularly with respect to base 212.

TEC 218 is mounted directly to thermal slug 210. In an exemplary embodiment, TEC 218 relies for its operation and usefulness on the Peltier effect wherein electrical power supplied to the TEC 218 may, according to the requirements of a particular application, cause selected portions of the TEC 218 to generate heat and/or provide a cooling effect. Exemplary construction materials for the TEC 218 may include, but are not limited to, bismuth-telluride combinations, or other materials with suitable thermoelectric properties. Please note that the TEC 218 represents an exemplary configuration only, and various other types of cooling devices may alternatively be employed as required to suit the dictates of a particular application. By way of example, where active temperature control of one or more electronic devices, aspects of which are discussed in more detail below, is not required, the TEC 218 may be replaced with a thermally conductive spacer or similar device.

Additionally, although the depicted embodiments describe an EML, other optical signal sources, such as a semiconductor laser or light emitting diode, are also compatible with various embodiments of the invention. Please also note that although reference is made herein to the use of EML 216 in conjunction with TEC 218, it should be understood that embodiments employing EML 216 are exemplary only and that additional or alternative devices may likewise be employed. Accordingly, the scope of the invention should not be construed to be limited solely to lasers and laser applications.

The ceramic feedthrough 220 further includes multiple electrically isolated conductive traces 214, or feedthroughs, extending throughout ceramic feedthrough 220 and consequently through base 212. The conductive traces 214 provide the electrical connections necessary between electrical devices or components located throughout the thermal slug 210. The conductive traces 214 and ceramic feedthrough 220 form a connector interface on the side of the base that is outside TO-can 206.

The connector interface formed by the surface of ceramic feedthrough 220 and conductive traces 214 is used to electrically connect the header assembly 204 to a second electrical subassembly, such as a printed circuit board, indirectly by an intermediary device comprising, for example, a flexible printed circuit. Alternatively, the connector interface could couple directly to a conventional printed circuit board by using, for example, a z-axis adhesive.

Typically, one of the conductive traces is a ground trace that may be electrically connected directly to base 212. Additionally, various types of devices are mounted on one side of the base of the header and connected to the traces. In this exemplary embodiment, such devices include, inter alia, a laser disposed on top of a TEC 218, which, in turn, is mounted to the ceramic feedthrough 220. Thus, power and control of the device is supplied to the laser and the TEC 218 by way of connectors on ceramic feedthrough 220, including one or more high speed data high speed data pads, one or more low speed data pads, and one or more high current pads.

In connection with the foregoing, it should be noted further that ceramics and metals are exemplary materials only and any other material or combination thereof that will facilitate implementation of the functionality disclosed herein may alternatively be employed. Moreover, other embodiments of the invention may employ different arrangements and numbers of, for example, conductive and non-conductive feedthroughs, or feedthroughs having other desirable characteristics. Accordingly, the illustrated embodiments are exemplary only and should not be construed to limit the scope of the invention in any way.

Regarding the operational aspects of TOSA 102, in general, power is provided to EML 216, TEC 218, and/or other electrical components by way of conductive traces 214 at connector interface of ceramic feedthrough 220. In response, EML 216 emits an optical signal. Heat generated as a result of the operation of EML 216 and/or other electronic components is continuously removed by TEC 218. The thermal slug 210 passes through base 212 and thereby ultimately transmits heat out of TOSA 102.

Figure 3A:
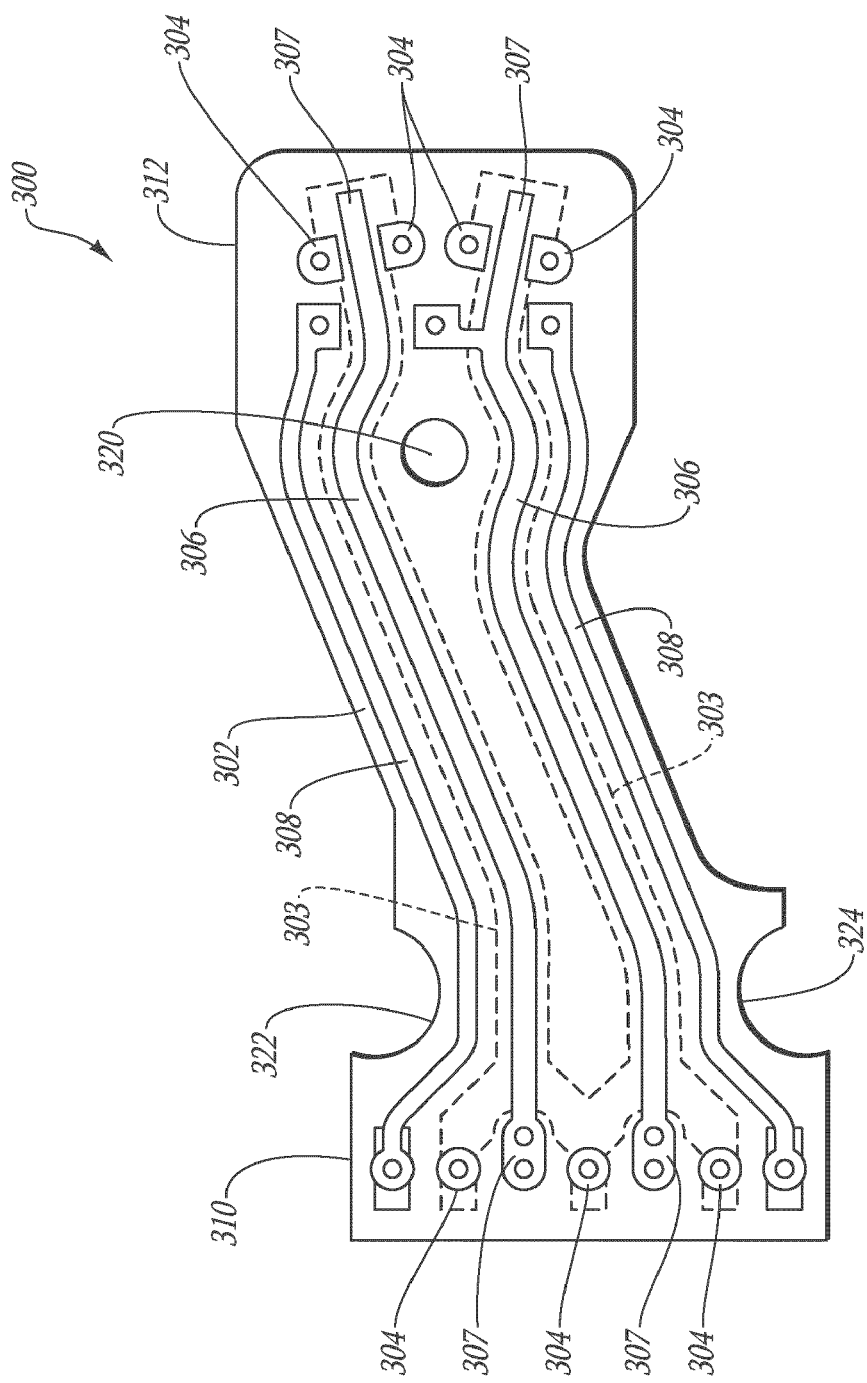
FIGS. 3A and 3B are schematic diagrams that illustrate aspects of a flexible circuit according to embodiments of the invention.
Figure 3B:
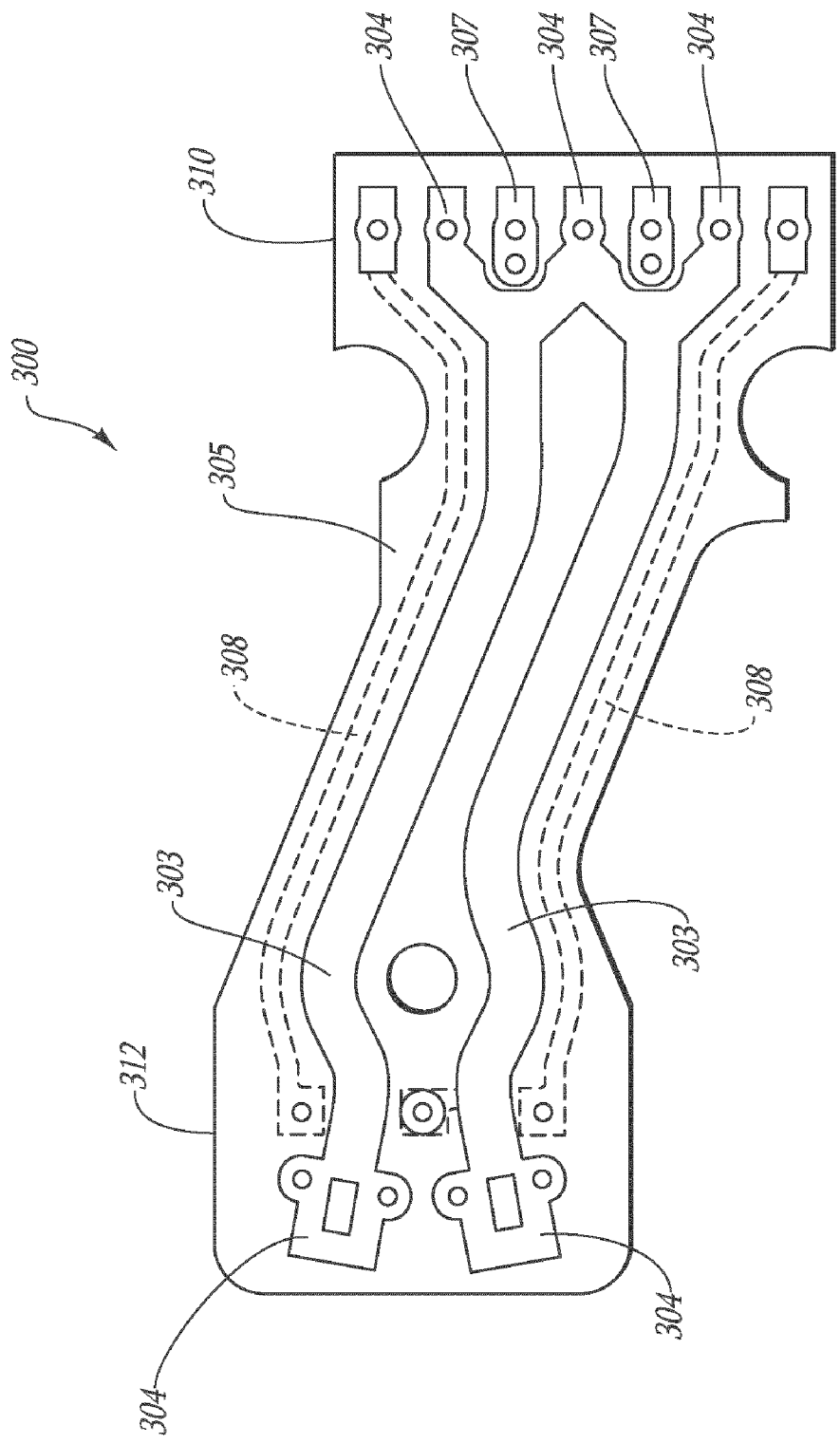

Reference is now made to FIGS. 3A and 3B collectively, which illustrate opposing views of first side 302 and second side 305 of one presently preferred embodiment of a flexible circuit 300, which is designed to interconnect a TOSA and a printed circuit board, similar to the function of flexible circuit 120. Generally, a flexible circuit is a patterned arrangement of printed wiring utilizing flexible base material with or without flexible cover layers. Flexible circuits are produced in several basic forms that generally parallel printed circuit board constructions. These include, for example, single-sided flexible circuits, double-sided flexible circuits, multilayer flexible circuits (having three or more conductor layers), and rigid flexible circuits. Regarding multilayer flexible circuits, the layers of the circuit are interconnected with plated-through holes.

Flexible circuits can be manufactured using a variety of materials, such as polyimide, polyester, LCP, Teflon, and the like. Embodiments of the invention use a carefully selected material to form the core layer of the flexible circuit in order to accommodate the Mdensity of electrical traces and pads thereon. Such materials may comprise, by way of example only, DuPont Pyralux® AP-8525 and DuPont Kapton® E. For example, DuPont Pyralux® AP-8525 is a double-sided, copper-clad laminate and is an all-polyimide composite of polyimide film bonded to copper foil.

General advantages of flexible circuit boards include size and weight reduction, reduced assembly time and costs, increased system reliability, improved controlled impedance, improved heat dissipation, and three-dimensional packaging capability. Because flexible circuits can seamlessly integrate form, fit, and function, flexible circuits can provide an excellent means of reducing assembly time of a product. Other benefits are derived from the ability to reduce the number of assembly operations required, and from the user's ability to construct and test the circuit completely prior to committing the circuit to assembly.

More specifically, however, flexible circuits are advantageous to the embodiments of the present invention because the positioning of the TOSAs and ROSAs remains unfixed during assembly. By being unfixed during assembly, the TOSA and ROSA can be precisely positioned for alignment of the laser transmission and reception of the device. Thus, the flexible circuit can be attached to a fixed printed circuit board and an unfixed TOSA or ROSA. The TOSA or ROSA is then aligned and finally fixed into place, if desired. Alternatively, the flexible circuit can be attached to a fixed TOSA or ROSA and an unfixed printed circuit board.

Additionally, after assembly the flexible circuits protect the printed circuit board, the TOSAs, the ROSAs, and other electrical structures from vibration, jarring, or excessive movement as optical cables are moved or attached and detached from nosepiece 201. This prevents device breakage or loss of electrical contact either from a single forceful event or from the gradual effects of vibration and optical cable attachment and detachment. This isolation also provides an outlet for differential thermal contraction/expansion.

Various embodiments of the flexible circuits according to the invention also comprise tooling hole 320 or scalloped-shaped surfaces 322, 324 that enable production machinery to hold and manipulate the flexible circuit during manufacture of the circuit and during assembly of the transceiver module.

The conductive traces on ceramic feedthrough 220, printed circuit board 106, and flexible circuits 108, 110, 300 may include, for example, high speed data traces, low speed data traces, ground traces, and device specific power traces, such as, for example, high current TEC traces. Generally, on printed circuit boards conductive traces and corresponding ground traces have a known preferred shape and arrangement depending on their function. For example, high current traces are relatively large and 50 ohm traces have a particular geometry. Because of the transition from the printed circuit board to the flexible circuit in embodiments of the invention, however, the traces must transition in space and size because of the different structure of the flexible circuit versus the printed circuit board. Additionally, the different characteristic impedances required of signal lines in embodiments of the invention, such as 25 or 50 ohms, places different requirements on the shape and size of each trace.

Thus, according to the invention and as depicted in FIGS. 3A through 6B, specific spatial relationships between ground traces 303, high speed data traces 306, ground pads 304, and high speed data pads 307 provide an improved high speed data performance and controlled impedance throughout the transition from printed circuit board to flexible circuit to platform. Please note that although both pads and plated holes are depicted in FIGS. 3-6 of the application and discussed herein, unless otherwise noted the plated holes and pads will be collectively referred to as pads for simplicity. Nevertheless, it will be understood that each plated hole is not necessarily a pad and each pad does not necessarily have a corresponding plated hole.

As a first example of a ground—high speed data trace spatial relationship, at the printed circuit board attached end 310, 408, 610 of the flexible circuit, the ground traces 303, 404, 606 split to form a y-shape that wraps around, on the opposing flexible circuit surface, and/or the same flexible circuit surface, each high speed data pad 307, 403, 608. In various embodiments two ground pads 304 are positioned on either side of each high speed data pad 307. Thus, in the flexible circuit ground traces 303 and ground pads 304 wrap around the signal trace 306 and signal pad 307 up producing a controlled amount of capacitance coupling between the signal and the ground. This compensates for the inductance of coming up from the ground plane or through the flex substrate. In one embodiment of the invention the wrap around ground trace is used on both the flexible circuit and on the printed circuit board.

As a second example of a ground—high speed data trace spatial relationship, at the platform attached end 312 of a flexible circuit, the ground trace forms a box shape that substantially surrounds, on the opposing flexible circuit surface, each high speed data pad 307. In various embodiments two ground pads 304 are positioned on either side of each high speed data pad 306. Thus, in the flexible circuit ground traces 303 and pads 304 wrap around the signal trace up producing a controlled amount of capacitance coupling between the signal and the ground. This compensates for the inductance of coming up from the ground plane. In one embodiment of the invention the wrap around ground trace is used on both the flexible circuit and on the printed circuit board.

Figure 6B:
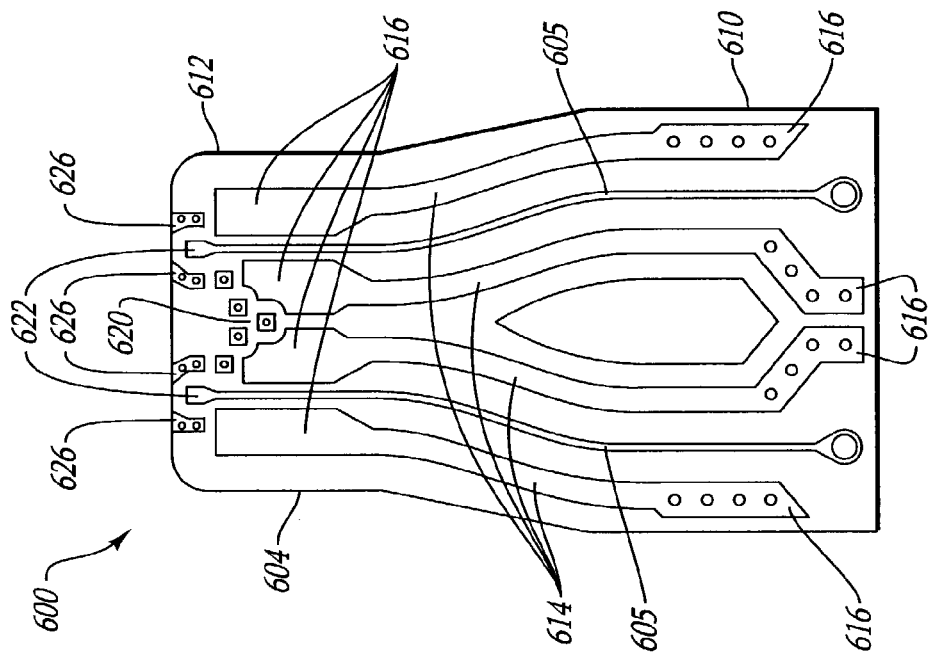
FIGS. 6A and 6B are schematic diagrams that illustrate aspects of a flexible circuit according to embodiments of the invention.
Figure 6A:
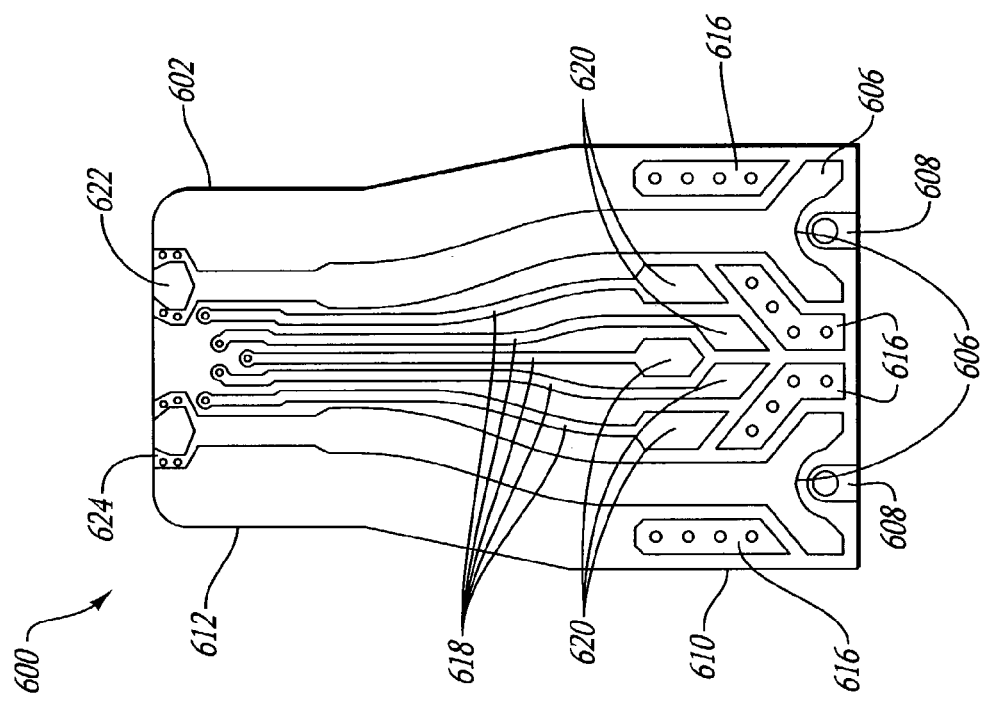

A third example of a ground—high speed data trace spatial relationship is depicted in FIGS. 6A and 6B of the application. In this embodiment, at the platform attached end 612 of a flexible circuit 600, the ground trace splits and forms a claw shape that does not substantially surround the adjacent high speed data pad, on the opposing flexible circuit surface, each high speed data pad 622. In various embodiments two ground pads 626 are positioned on either side of each high speed data pad 622. Thus, in the flexible circuit ground traces 606, 624, and pads 626 wrap around the signal trace 605 and signal pad 622 up producing a controlled amount of capacitance coupling between the signal and the ground. This compensates for the inductance of coming up from the ground plane. In one embodiment of the invention the wrap around ground trace is used on both the flexible circuit and on the printed circuit board.

Of course the foregoing examples of ground—high speed data trace spatial relationships can be incorporated at either end of the flexible circuits or in the adjacent electrical devices. The foregoing description merely corresponds to the illustrated embodiments of the invention. The foregoing embodiments of ground—high speed data trace spatial relationships also obtain an improved high speed data performance that is required for 10 or 40 GBit applications, for example.

The high speed data pads and traces are an optimized wave guide in a particular geometry to allow a very high speed data performance. The traces have a ground plane underneath and are formed as a trace having a width that uniquely determines the E impedance of the trace. The wider the trace, the lower the impedance. As illustrated in FIGS. 3A and 3B, high speed data traces 306 are on first surface 302 whereas ground trace 303 is on the opposing second side 305. Additionally, high speed data contact pads require a very specifically designed wave guide shape as depicted in FIGS. 3-6. The specifically designed wave guide shape has a very good high speed data performance for the transition from the flexible circuit into the header or printed circuit boards in order to obtain a very high bandwidth that is extensible to, for example, 40 Gbit applications.

Although not depicted in FIGS. 3A and 3B, high current traces also present unique challenges in designing acceptable flexible circuits and corresponding interfaces to adjacent electronic devices. The high current traces require a larger area and therefore comprise a relatively thick trace with large contact pads. Such high current traces with a larger surface area are present on FIGS. 6A and B, with pads 616 and traces 614. These larger pads are particularly important when a z-axis film or epoxy is used for attachment in lieu of a solder attachment.

Other conductive traces on flexible circuit 300 include low speed data traces 308 such as, for example, thermistors traces for temperature measurement and feedback, monitor photodiode traces for optical launch power measurement and feedback, wavelength locker traces for direct wavelength measurement and feedback, and other traces for bias current or voltage monitoring resistors or devices.

Accordingly, the present invention may incorporate specific shape optimized high speed data contacts, low speed data contacts, high current contacts, and ground contacts all within a two dimensional defined space that conventionally is occupied by a single row of contacts. Thus, in the illustrated embodiment of FIGS. 3A and 3B the TOSA side 312 of flexible circuit 300 has a two dimensional array of contacts whereas the printed circuit board side 310 of flexible circuit 300 has a generally one dimensional array of contacts, notwithstanding some two dimensional features to improve high speed data performance.

Embodiments of the invention also use a z-axis epoxy to affix the flexible circuit interface to the printed circuit board or TOSA platform interface. A z-axis epoxy conducts only in the up and down direction, not side to side. Thus, conduction between corresponding contacts is minimally impacted while there is no risk that adjacent traces will short. Examples of suitable Z-axis adhesives include the Z-Axis Adhesive Film 5552R available from 3M of St. Paul, Minn.

Figure 4A:
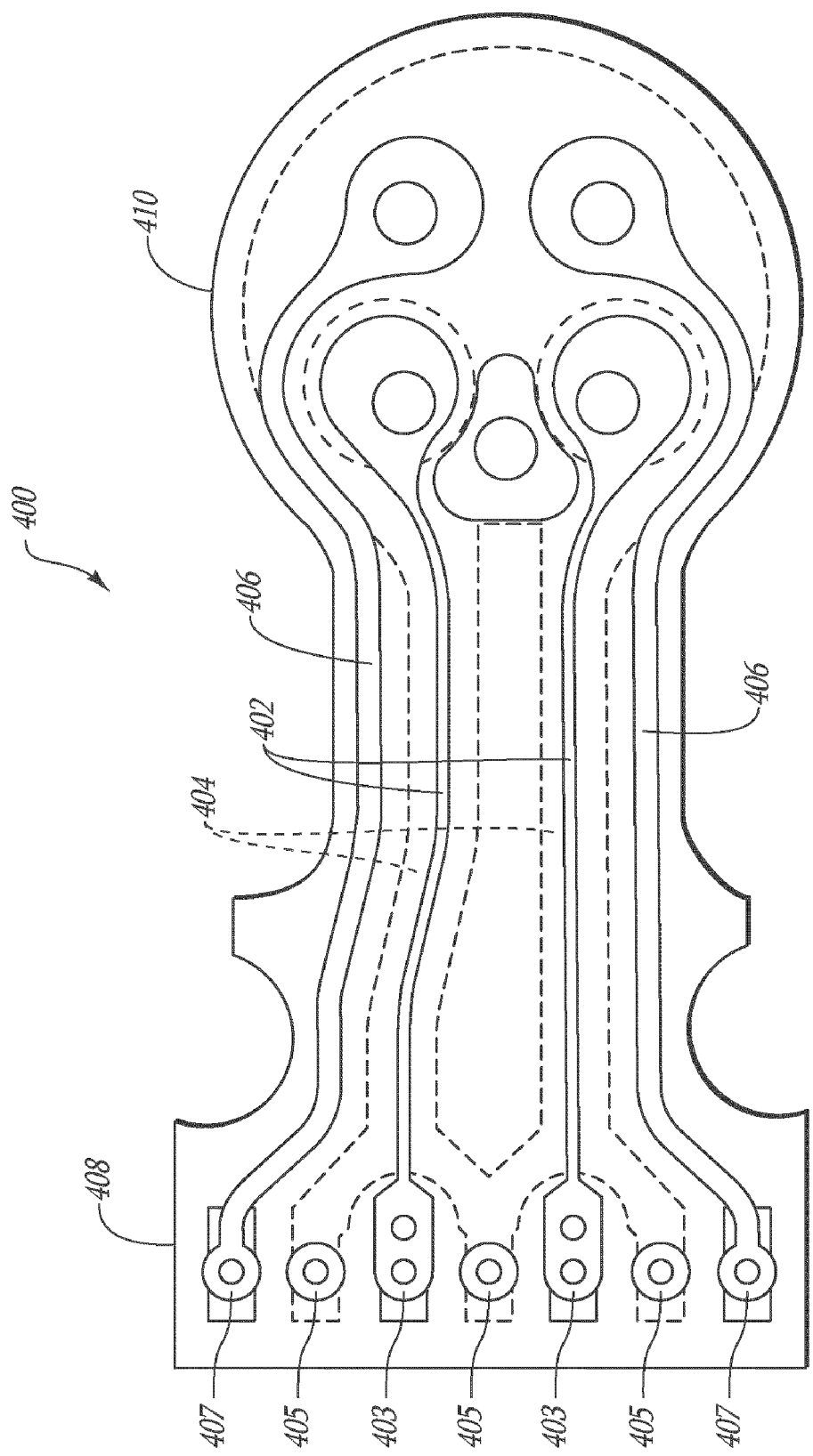
FIGS. 4A and 4B are further schematic diagrams that illustrate aspects of a flexible circuit according to embodiments of the invention.
Figure 4B:
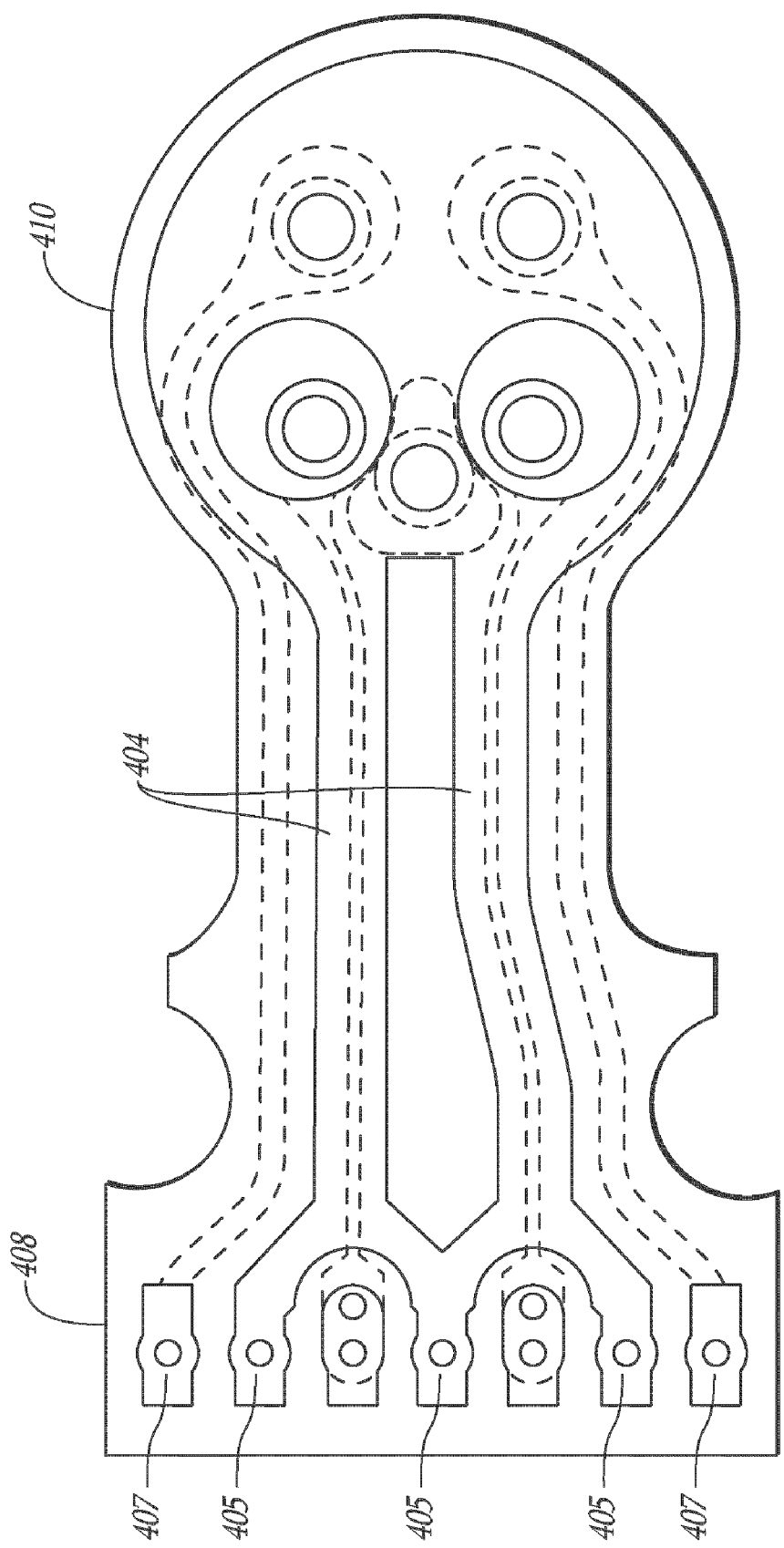

Referring now to FIGS. 4A and 4B, depicted is a flexible circuit 400 designed to interconnect a ROSA and a printed circuit board, similar to the function of flexible circuit 110. Accordingly, flexible circuit 400 comprises high speed data traces 402, high speed data pads 403, ground traces 404, ground pads 405, low speed data traces 406 and low speed data pads 407. Pads 403, 405, 407 are in a substantially linear array at printed circuit board end 408 of flexible circuit 400, with ground traces 404 on the opposing surface of the flexible circuit from high speed data traces 402 and ground pads 405 on wrapping around high speed data pads 403 so as to provide a controlled impedance.

At the ROSA attached end 410 of flexible circuit 400, conventional openings are formed for mating with conductive pins on the ROSA. A soldering process completes the joining of flexible circuit 400 to the ROSA. Solder fillets are formed in the areas where the pads substantially exceed the diameter of the hole, since there are cover layer openings there. The ground plane is relieved around the pads to minimize parasitic capacitance, and the thin high speed data traces are flared to prevent trace breakage. There is an integrated Kapton stiffening washer bonded to the ROSA side of the flex to prevent flexing in the solder region and to thus prevent trace and solder joint breakage.

Figure 5:
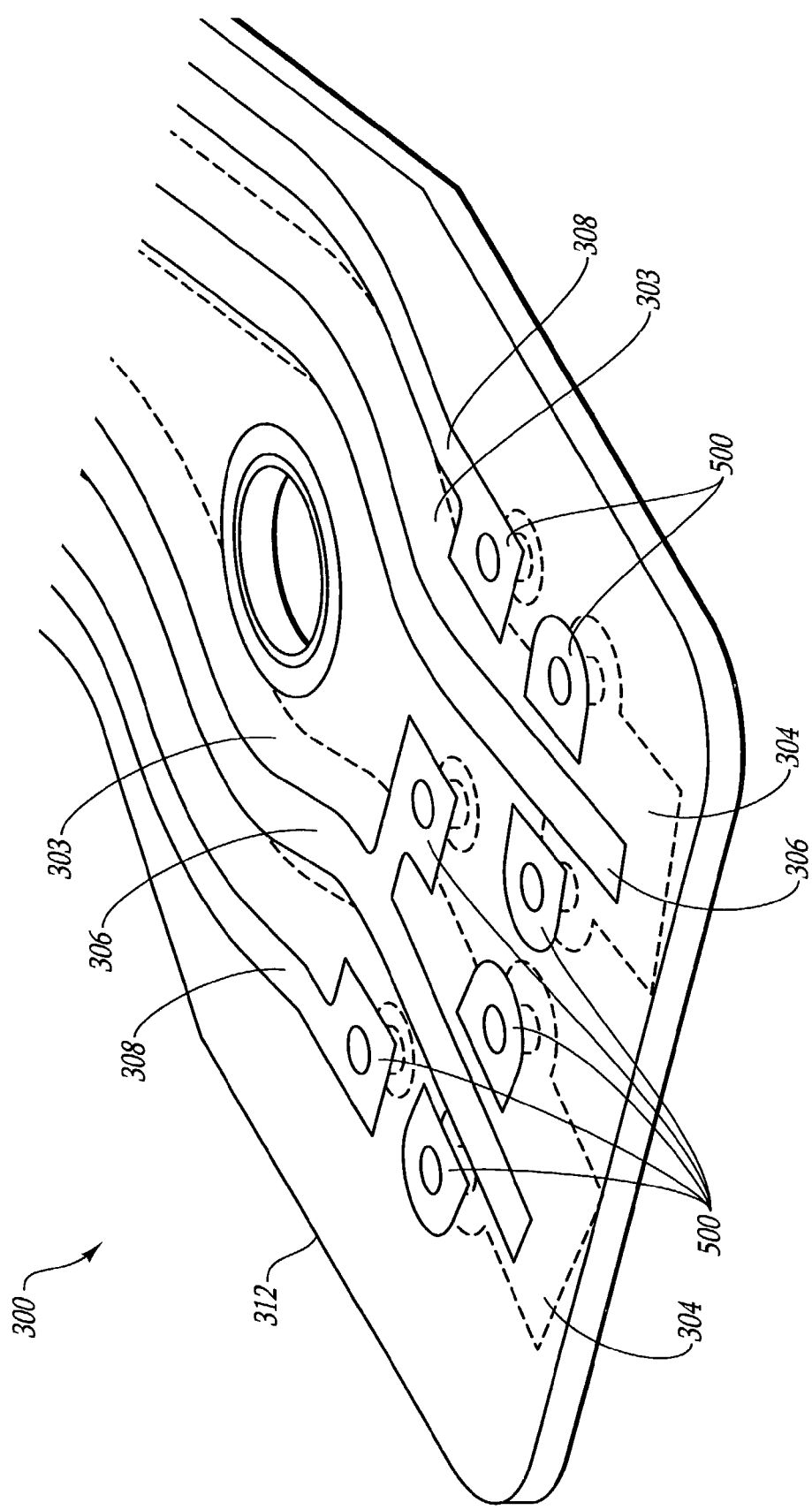
FIG. 5 is an additional schematic diagram that illustrates aspects of a flexible circuit according to embodiments of the invention.

Referring now to FIG. 5, a perspective view of the TOSA attached end 312 of flexible circuit 300 is presented. This view illustrates the multilayer structure of flexible circuit 300. Thus, it can be seen the locations of plated holes 500 and pads for each of the high speed data traces 306, ground trace 303, and low speed data traces 308. It can also be clearly seen that ground trace 303 are primarily on an opposing surface of flexible circuit 300 from high speed data traces 306. The manner in which the ground trace 303 wrap around the high speed data traces 306 according to the invention is also depicted. The plated holes 500 serve to connect electrical signals through the two layer structure and to provide a convenient thermal path for soldering or epoxy curing, among other uses.

Referring now to FIGS. 6A and 6B collectively, depicted are opposing first surface 602 and second surface 604 of a flexible circuit 600 according to the invention. Flexible circuit 600 comprises ground traces 606 that wrap around high speed data pads 608 at a printed circuit board attached end 610 and form a claw shape at the platform attached end 612 of the flexible circuit 600.

FIGS. 6A and 6B additionally illustrate the large size of high current traces 614 and pads 616. Because of both the large size requirements of high current data traces 614 and the unique ground—high speed data trace spatial relationships (wrap around, box, claw) of ground traces, ground pads, high speed data traces, and high speed data pads, the present invention may advantageously use a two dimensional arrangement of pads at each interface with an adjacent electronic device. This two dimensional arrangement allows for the use of a much greater number of conductive pads, and hence traces, on a flexible circuit. Additionally, because of the two dimensional arrangement each can pad and trace can also be more flexibly shaped to create a sufficiently large pad or configure an ideal ground—high speed data trace spatial relationship, or for an optimized shape to increase high speed data performance and bandwidth.

Also depicted in FIGS. 6A and 6B are low speed data traces 618 and pads 620. As illustrated in this embodiment of the invention, the low speed data pads may comprise either plated through holes or pads designed to have a relatively large surface area. As with the previously described low speed data traces and pads, low speed data traces 618 and pads 620 may be thermistor traces for temperature measurement and feedback, monitor photodiode traces for optical launch power measurement and feedback, wavelength locker traces for direct wavelength measurement and feedback, and other traces for bias current or voltage monitoring resistors or devices Accordingly, the two-dimensional connection interface geometry disclosed herein permit higher pad density, the use of a specific high speed data geometry to obtain improved high speed data transmission performance, the use of additional conductive lines, and the use of larger conductive pads.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

What is claimed is:

1. A flexible circuit comprising:
    a flexible substrate having first and second opposing surfaces;
    a first connecting area comprising a first data pad on the first surface;
    a second connecting area comprising a second data pad on the first surface;
    a first conductive trace on the first surface of the flexible substrate, the first conductive trace conductively connecting the first data pad to the second data pad; and
    a ground trace on the second surface of the flexible substrate and having at least one contact pad on at least one of the first connecting area and the second connecting area, the ground trace having a portion that is adjacent to but not in contact with at least one of the first data pad and the second data pad, wherein the ground trace connects through the flexible substrate to ground pads on the first surface, the ground pads positioned on both sides of the first conductive trace such that the ground trace and the ground pads wrap around the first conductive trace, wherein the ground trace is arranged to maintain an impedance by producing a controlled amount of capacitance that compensates for inductance associated with coming up from the ground trace or through the flexible substrate.

2. The flexible circuit as defined in claim 1, wherein the portion of the ground trace that is adjacent to but not in contact with at least one of the first data pad and the second data pad forms a box shape having an opening therein, the ground trace substantially surrounding the adjacent data pad.

3. The flexible circuit as defined in claim 1, wherein the portion of the ground trace that is adjacent to but not in contact with at least one of the first data pad and the second data pad forms a claw shape that surrounds portions of, but not all of, the adjacent data pad.

4. The flexible circuit as defined in claim 1, wherein the portion of the ground trace that is adjacent to but not in contact with at least one of the first data pad and the second data pad wraps around a portion of the adjacent data pad.

5. The flexible circuit as defined in claim 1, further comprising:
- a first thermoelectric cooler pad at the first connecting area;
- a second thermoelectric cooler pad at the second connecting area; and
- a third conductive trace conductively connecting the first thermoelectric cooler pad to the second thermoelectric cooler pad, at least one of the first thermoelectric cooler pad and the second thermoelectric cooler pad having a larger surface area than the surface area of the adjacent data pad.

6. The flexible circuit as defined in claim 1, wherein the flexible circuit is configured for conductively connecting a transmitter optical subassembly to a printed circuit board.

7. The flexible circuit as defined in claim 1, wherein the substrate comprises multiple layers.

* * * * *

UNITED STATES PATENT AND TRADEMARK OFFICE
CERTIFICATE OF CORRECTION

PATENT NO. : 7,439,449 B1
APPLICATION NO. : 10/409837
DATED : October 21, 2008
INVENTOR(S) : Kumar et al.

It is certified that error appears in the above-identified patent and that said Letters Patent is hereby corrected as shown below:

Title Page
Item 56, References Cited, Other Publications, remove one instance of [XFP MSA Group; http://www.org/cgi-bin/home.cgi]

Column 1
Line 11, change "Device," to --Device",--
Line 14, change "Assembly," to --Assembly",--

Column 2
Line 31, change "devices such as TOSAs" to --devices, such as TOSAs--

Column 3
Line 7, change "The impedance" to --The impedance,--
Lines 7 and 8, change "microstrip," to --microstrip--
Line 16, change "invention" to --invention,--
Line 29, change "invention" to --invention,--
Line 42, change "invention" to --invention,--
Line 63, change "soldering" to --soldering.--
Line 65, change "and in part" to --and, in part,--

Column 5
Line 41, change "and therefore" to --and, therefore,--
Line 44, remove [for example] after "XFP MSA standards,"
Line 48, insert --for example,-- after "Dec. 16, 2002,"
Line 67, change "TOSA assemblies, for example including such" to --TOSA assemblies may include features not previously mentioned, for example,--

Column 6
Line 1, change "features as" to --features such as--
Line 26, change "TOSA 102" to --TOSA 200--
Line 34, insert --("TO-can")-- after "hermetically sealed window can"
Line 49, insert --206-- after "TO-can"
Line 51, insert --212-- after "base"
Line 65, change "material such as a ceramic" to --material, such as a ceramic,--

Column 7
Line 54, insert --214-- after "conductive traces"
Line 57, insert --204-- after "header"
Line 57, insert --514-- after "traces"

Column 8
Line 9, change "TOSA 102" to --TOSA 200--
Line 23, change "120." to --108 (FIG. 1).--

Column 9
Line 1, insert --(FIG. 2)-- after "201"
Line 11, insert --(FIG. 2)-- after "220"
Line 12, insert --(FIG. 1)-- after "106"
Line 12, insert --(FIG. 1)-- after "108"
Line 12, insert --(FIG. 1)-- after "110"
Line 36, remove [unless otherwise noted] after "herein,"
Line 37, change "for simplicity" to --for simplicity, unless otherwise noted.--
Line 47, change "embodiments" to --embodiments,--
Line 48, remove [in] after "Thus,"
Line 50, change "signal pad 307 up producing" to --signal pad 307, producing--
Line 52, remove [of] after "inductance"
Line 54, change "invention" to --invention,--
Line 59, insert --300-- after "flexible circuit"
Line 59, insert --303-- after "ground trace"
Line 61, change "embodiments" to --embodiments,--
Line 63, change "data pad 306. Thus, in" to --data pad 307. Thus,--
Line 64, change "signal trace up producing" to --signal trace 306, producing--
Line 66, remove [of] after "inductance"

Column 10
Line 1, change "invention" to --invention,--
Line 6, insert --606-- after "ground trace"
Line 8, insert --622-- after "data pad"
Lines 8 and 9, change "circuit surface, each high speed data pad 622." to --circuit surface.--
Line 9, change "embodiments" to --embodiments,--
Line 13, remove [up] after "622"
Line 15, remove [of] after "inductance"
Line 16, change "invention" to --invention,--
Line 36, change "shape as depicted in FIGS. 3-6" to --shape, as depicted in FIGS. 3A-6--
Line 39, change "boards" to --boards,--
Line 48, change "B" to --3B--
Line 52, change "300" to --300,--
Line 65, change "3B" to --3B,--

Column 11
Line 14, change "flexible circuit 110." to --flexible circuit 110 (FIG. 1).--
Line 21, change "traces 402 and ground pads 405" to --traces 402. Ground pads 405--
Line 22, change "on wrapping around" to --also wrap around--
Line 42, change "ground trace 303" to --ground traces 303--
Line 66, change "and hence traces," to --and hence, trances,--

Column 12
Line 1, change "arrangement each can" to --arrangement, each--
Line 3, change "relationship, or" to --relationship, or,--
Line 4, change "optimized shape" to --optimized shape,--
Line 8, add --620-- after "data pads"

Signed and Sealed this

Twenty-third Day of February, 2010

David J. Kappos
*Director of the United States Patent and Trademark Office*